(12) United States Patent
Palacios et al.

(10) Patent No.: US 8,114,717 B2
(45) Date of Patent: Feb. 14, 2012

(54) METHODS TO SHAPE THE ELECTRIC FIELD IN ELECTRON DEVICES, PASSIVATE DISLOCATIONS AND POINT DEFECTS, AND ENHANCE THE LUMINESCENCE EFFICIENCY OF OPTICAL DEVICES

(75) Inventors: Tomas Palacios, Cambridge, MA (US); Likun Shen, Goleta, CA (US); Umesh K. Mishra, Montecito, CA (US)

(73) Assignee: The Regents of the University of California, Oakland, CA (US)

( * ) Notice: Subject to any disclaimer, the term of this patent is extended or adjusted under 35 U.S.C. 154(b) by 861 days.

(21) Appl. No.: 11/599,874

(22) Filed: Nov. 15, 2006

(65) Prior Publication Data
US 2007/0224710 A1 Sep. 27, 2007

Related U.S. Application Data

(60) Provisional application No. 60/736,628, filed on Nov. 15, 2005.

(51) Int. Cl.
*H01L 21/335* (2006.01)
(52) U.S. Cl. ........ 438/142; 438/167; 438/172; 257/192; 257/194; 257/E21.403; 257/E21.407
(58) Field of Classification Search .................. 438/142, 438/167, 172; 257/194, E21.403, E21.407, 257/192
See application file for complete search history.

(56) References Cited

U.S. PATENT DOCUMENTS
4,240,096 A 12/1980 Hiraki et al.
5,084,743 A 1/1992 Mishra et al.
(Continued)

FOREIGN PATENT DOCUMENTS
EP 186058 7/1986
JP 62-19897 8/1988

OTHER PUBLICATIONS

Cai et al. (IEEE Electron Device Letters, vol. 26, No. 7, pp. 435-437, Jul. 2005 High-Performance Enhancement-Mode AlGaN/GaN HEMTs Using Fluoride-Based Plasma Treatment).*
Furutsuka et al., "Improvement of the Drain Breakdown Voltage of GaAs Power MESFET's by a Simple Recess Structure," IEEE Trans. on Electron Dev., Jun. 1978, p. 563, vol. 6.

(Continued)

*Primary Examiner* — Khiem D Nguyen
(74) *Attorney, Agent, or Firm* — Gates & Cooper LLP

(57) ABSTRACT

A fluorine treatment that can shape the electric field profile in electronic devices in 1, 2, or 3 dimensions is disclosed. A method to increase the breakdown voltage of AlGaN/GaN high electron mobility transistors, by the introduction of a controlled amount of dispersion into the device, is also disclosed. This dispersion is large enough to reduce the peak electric field in the channel, but low enough in order not to cause a significant decrease in the output power of the device. In this design, the whole transistor is passivated against dispersion with the exception of a small region 50 to 100 nm wide right next to the drain side of the gate. In that region, surface traps cause limited amounts of dispersion, that will spread the high electric field under the gate edge, therefore increasing the breakdown voltage. Three different methods to introduce dispersion in the 50 nm closest to the gate are described: (1) introduction of a small gap between the passivation and the gate metal, (2) gradually reducing the thickness of the passivation, and (3) gradually reducing the thickness of the AlGaN cap layer in the region close the gate.

53 Claims, 8 Drawing Sheets

U.S. PATENT DOCUMENTS

| | | | | |
|---|---|---|---|---|
| 5,236,547 | A | * | 8/1993 | Takahashi et al. ............ 438/498 |
| 5,796,127 | A | * | 8/1998 | Hayafuji et al. .............. 257/194 |
| 6,049,091 | A | * | 4/2000 | Yokoyama ...................... 257/52 |
| 6,720,213 | B1 | * | 4/2004 | Gambino et al. ............. 438/184 |
| 6,825,133 | B2 | * | 11/2004 | Yu et al. ........................ 438/787 |
| 7,638,818 | B2 | * | 12/2009 | Wu et al. ....................... 257/192 |
| 2002/0055213 | A1 | * | 5/2002 | Sugino et al. ................ 438/200 |
| 2005/0077541 | A1 | | 4/2005 | Shen et al. |
| 2005/0077547 | A1 | * | 4/2005 | Jumpertz et al. ............. 257/213 |
| 2007/0059873 | A1 | | 3/2007 | Chini et al. |
| 2007/0295993 | A1 | * | 12/2007 | Chen et al. ................... 257/194 |

OTHER PUBLICATIONS

Chini, A. et al., "Power and Linearity Characteristics of Field-Plated Recessed-Gate AlGaN-GaN HEMTs,"IEEE Electron Dev. Lett., May 2004, p. 229, vol. 25., No. 5.

Xing, H. et al., "High Breakdown Voltage AlGaN-GaN HEMTs Achieved by Multiple Field Plates," IEEE Electron Dev. Lett., Apr. 2004, p. 161, vol. 25, No. 4.

Palacios, T. et al., "Influence of the Dynamic Access Resistance in the gm and fT Linearity of AlGaN/GaN HEMTs," IEEE Trans. on Electron Dev., Oct. 2005, pp. 2117-2123, vol. 52, No. 10.

Cai, Y. et al., "High-Performance Enhancement-Mode AlGaN/GaN HEMTs Using Fluoride-Based Plasma Treatment," IEEE Electron Dev. Lett. Jul. 2005, pp. 435-437, vol. 26, No. 7.

Vetury, R. et al., "The Impact of Surface States on the DC and RF Characteristics of AlGaN/GaN HFETs," IEEE Trans. Electron Dev., Mar. 2001, pp. 560-566, vol. 48, No. 3.

Shen, L. et al., "High-Power Polarization-Engineered GaN/AlGaN/GaN HEMTs Without Surface Passivation," IEEE Electron Dev. Lett., Jan. 2004, pp. 7-9, vol. 25, No. 1.

Aleksov et al., RF performances of surface channel diamond FETs with sub-micron gate length, Diamond and Related Materials, Mar.-Jun. 2002, vol. 11, issue 3-6, pp. 382-386.

Wright et al., The effect of flourine in silicon dioxide gate dielectrics, IEEE Transactions on Electron Devices, May 1989, vol. 36, issue 5, pp. 879-889.

* cited by examiner

METHODS TO SHAPE THE ELECTRIC FIELD IN ELECTRON DEVICES, PASSIVATE DISLOCATIONS AND POINT DEFECTS, AND ENHANCE THE LUMINESCENCE EFFICIENCY OF OPTICAL DEVICES

CROSS-REFERENCE TO RELATED APPLICATIONS

This application claims the benefit under 35 U.S.C Section 119(e) of U.S. Provisional Application Ser. No. 60/736,628, filed on Nov. 15, 2005, by Tomas Palacios, Likun Shen and Umesh K. Mishra, entitled "FLUORINE TREATMENT TO SHAPE THE ELECTRIC FIELD IN ELECTRON DEVICES, PASSIVATE DISLOCATIONS AND POINT DEFECTS, AND ENHANCE THE LUMINESCENCE EFFICIENCY OF OPTICAL DEVICES," (2006-129);

Which application is incorporated by reference herein.

This application is related to the following co-pending and commonly-assigned application:

U.S. Utility application Ser. No. 10/570,964, filed on Mar. 8, 2006, by Alessandro Chini, Umesh K. Mishra, Primit Parikh and Yifeng Wu, entitled "FABRICATION OF SINGLE OR MULTIPLE GATE FIELD PLATES", now U.S. Pat. No. 7,812,369, issued Oct. 12, 2010, (2004-091), which application claims the benefit under 35 U.S.C Section 365(c) of PCT Application Serial No. US2004/029324, filed on Sep. 9, 2004, by Alessandro Chini, Umesh K. Mishra, Primit Parikh and Yifeng Wu, entitled "FABRICATION OF SINGLE OR MULTIPLE GATE FIELD PLATES", (2004-091), which application claims the benefit under 35 U.S.0 Section 119(e) of U.S. provisional Patent Application Ser. No. 60/501,557, filed on Sep. 9, 2003, by Alessandro Chini, Umesh K. Mishra, Primit Parikh and Yifeng Wu, entitled "FABRICATION OF SINGLE OR MULTIPLE GATE FIELD PLATES", (2004-091);

U.S. Utility patent application Ser. No. 10/962,911, filed on Oct. 12, 2004, by, by Likun Shen, Sten J. Heikman and Umesh K. Mishra, entitled "GAN/ALGAN/GAN DISPERSION-FREE HIGH ELECTRON MOBILITY TRANSISTORS," now U.S. Pat. No. 7,700,973, issued Apr. 20, 2010, (2003-177), which application claims the benefit under 35 U.S.C Section 119(e) of U.S. Provisional Application Ser. No. 60/510,695, filed on Oct. 10, 2003, by Likun Shen, Sten J. Heikman and Umesh K. Mishra, entitled "GAN/ALGAN/GAN DISPERSION-FREE HIGH ELECTRON MOBILITY TRANSISTORS," (2003-177);

U.S. Utility application Ser. No. 11/523,268, filed on Sep. 18, 2006, by Siddharth Raj an, Chang Soo Suh, James S. Speck and Umesh K. Mishra, entitled "N-POLAR ALUMINUM GALLIUM NITRIDE/GALLIUM NITRIDE ENHANCEMENT-MODE FIELD EFFECT TRANSISTOR," (2006-107); which application claims the benefit under 35 U.S.C Section 119(e) of U.S. Provisional Application Ser. No. 60/717,996, filed on Sep. 16, 2005, by Siddharth Rajan, Chang Soo Suh, James S. Speck and Umesh K. Mishra, entitled "N-POLAR ALUMINUM GALLIUM NITRIDE/GALLIUM NITRIDE ENHANCEMENT-MODE FIELD EFFECT TRANSISTOR," (2006-107);

U.S. Provisional Patent Application Ser. No. 60/736,715, filed on Nov. 15, 2005, by Tomas Palacios and Umesh K. Mishra, entitled "METHOD FOR FABRICATING DEEP-SUBMICRON GATES WITH ARBITRARY SHAPES FOR TRANSISTORS," (2006-151-1); and U.S. Provisional Application Ser. No. 60/822,866, filed on Aug. 18, 2006, by Chang Soo Suh, Yuvaraj Dora and Umesh K. Mishra, entitled "HIGH BREAKDOWN ENHANCEMENT MODE GaN-BASED HEMTs WITH INTEGRATED SLANT FIELD PLATE," (2006-730).

which applications are incorporated by reference herein.

STATEMENT REGARDING FEDERALLY SPONSORED RESEARCH AND DEVELOPMENT

This invention was made with Government support under Grant Nos. ONR/N00014-01-1-0764 (CANE MURI) and NAVY/N00014-05-1-0419 (MINE MURI) awarded by ONR. The Government has certain rights in this invention.

BACKGROUND OF THE INVENTION

1. Field of the Invention

The present invention is related to a fluorine treatment to shape the electric field in electron devices, passivate dislocations and point defects, and enhance the luminescence efficiency of optical devices, as well as manufacturing methods to obtain a high power field effect transistor without degradation in its high frequency performance.

2. Description of the Related Art (Note: This application references a number of different publications and patents as indicated throughout the specification by one or more reference numbers within brackets, e.g., [x]. A list of these different publications and patents ordered according to these reference numbers can be found below in the section entitled "References." Each of these publications and patents is incorporated by reference herein.)

The ability to locally change the electric field distribution can substantially improve the performance of different kinds of devices, for example, field effect transistors, high electron mobility transistors (HEMTs), light emitting diodes (LEDs), and ultraviolet detectors. In a standard AlGaN/GaN HEMT, for example, the electric field peaks at the drain side of the gate and consequently, the drain side of the gate constitutes the weak point through which breakdown occurs due to impact ionization.

Field effect transistors are commonly used as power amplifier devices. In power amplifiers, the maximum output power is proportional to the maximum current of the device and to the maximum voltage swing at the drain electrode. The maximum current is limited by material parameters, such as electron mobility and carrier density, while the voltage swing is, in first approximation, limited by the breakdown voltage of the device. In order to maximize the output power of a transistor, both the drain current and the voltage swing need to be increased.

There are different methods to increase the breakdown voltage of field effect transistors. One way is to limit the maximum drain current of the device, as shown for example, in [1]. Unfortunately, this method is not suited for high power applications, as the output power that results from this trade-off of current versus voltage is roughly constant.

A second method to increase the breakdown voltage was presented by Mishra et al [2]. In GaAs devices, the gate leakage has been identified as the main cause for the reduction of the breakdown voltage. In this method, Mishra et al. used a thin electron trap layer, on the surface of the device, to trap the electrons which flow on the surface between the drain and the gate [2]. This trap reduces the gate leakage, improving the breakdown voltage of the devices.

The other methods to increase the breakdown voltage of the device are based on reducing the peak electric field under the gate. Normally, the main voltage drop in the channel of field effect transistors occurs in a very confined region of about 50 nm at the drain side of the gate.

FIG. 1 shows how the main voltage drop in the channel of field effect transistors occurs in a very confined region of about 50 nm at the drain side of the gate, causing the electric field to peak in this confined region and reach very high values, typically greater than 100 KV/cm. FIG. 1 is a schematic of an AlGaN/GaN HEMT, comprising a source (100), drain (101), gate (102) and channel (103), superimposed on a graph illustrating the typical electric field profile in the channel (103). In this example, the drain source voltage ($V_{DS}$) is 10 V and the gate-source voltage ($V_{GS}$) is −6 V. When the drain voltage is increased, the peak electric field increases as well, and at a certain level of the drain voltage, the breakdown electric field is reached. At that point the transistor enters in breakdown regime and impact ionization of the carriers occurs, leading to increased leakage current and ultimately to the destruction of the device.

In order to increase the breakdown voltage, the electric field needs to be spread out, for example by an additional 50-100 nm towards the drain side of the gate. As the integral of the longitudinal electric field over the channel length is equal to the applied drain voltage, spreading out the electric field will reduce the peak electric field, in order to keep the area constant (i.e. the drain voltage does not change). Therefore, a higher drain voltage is needed to reach the breakdown electric field, which will increase the maximum output power.

Two main options to shape the electric field at the drain side of the gate are described in the literature. On one hand, recess engineering has proven to be a useful technique for shaping the electric field. The main idea behind multiple recess engineering is to increase the breakdown voltage of the devices, by reducing the charge density in the drain access region of the transistor [3,4]. In this technique, the device surface is brought closer to the channel by recessing the barrier layer, so that the surface potential will partially deplete the channel, and spread the electric field next to the gate, thereby reducing the peak value of the electric field.

However, the recess engineering method presents several important problems. First, it introduces parasitic resistances that will harm the frequency performance of the device. In particular, the method increases the drain access resistance, which in turn decreases the high frequency performance of the device. Second, to allow a controlled recess at the drain side of the gate, wet etching is normally used. This wet etch is not available for many semiconductor families, such as the nitrides for example. Third, the use of recesses in the access region decreases the distance between the channel and the surface of the semiconductor. This is likely to introduce dispersion in nitride-based devices, due to the higher effect of surface traps when they are close to the channel. Finally, another problem of multiple recesses is that the dry etch induces damage into the semiconductor that significantly increases the gate leakage of the devices.

The second technique involves the use of field plated structures, like the one shown in FIG. 2, to achieve electric field shaping. FIG. 2 is a schematic of a HEMT comprising a field plate structure (FP) (200), source (201), gate (202), drain (203), silicon nitride layer (204), AlGaN layer (205), and GaN layer (206). In this kind of device, the field plate structure (200), which can be connected to the source (201), to the gate (202), left floating or connected to an arbitrary voltage source, will modulate the carrier density at the drain side of the gate. The modulation will change the electric field in the drain region of the device by reducing its peak value at the gate edge. In this way, the breakdown voltage will be increased [5,6].

However, this second approach has the problem of significantly increasing the parasitic capacitances of the device.

FIG. 3 shows how, in a transistor, as the thickness of the silicon nitride layer is increased, and when the FP is added to transistor, there is a parasitic increase in the gate-drain capacitance $C_{gd}$. The increase is independent of the length of the gate $L_G$, at least in the range 50-250 nm. This increase in $C_{gd}$ causes a reduction in the maximum frequency at which the transistor can operate. Therefore, this method is not a good option for high frequency devices [5,6], for example, high power devices operating at frequencies higher than 20 GHz. Furthermore, field plates require at least one additional lithography and metal evaporation process step. Although a transistor was used as an example, the parasitic increase in capacitance is also present in other similar devices.

What is needed, therefore, are improved techniques for locally changing the electric field distribution. The present invention satisfies these needs. In this document, new techniques to increase the breakdown voltage of field effect transistors, without degrading the maximum available current or the high frequency performance will be described. These new methods are based on the trap-related dispersion present in many semiconductors, especially in nitrides, due to surface states, and on the introduction of fixed charge into the devices.

SUMMARY OF THE INVENTION

The present invention discloses a method for shaping an electric field in an electron device, comprising performing a fluorine treatment on the electron device using negatively-charged fluorine ions to locally modify or shape the electric field's profile or distribution in the electron device. The electron device is nitride based, for example a high electron mobility transistor (HEMT). The negatively-charged fluorine atoms may be a negative sheet of charge that extends from the surface and stops before a channel of the HEMT, or they could also extend deeper into the buffer layer.

The fluorine treatment may be performed by implantation, thermal diffusion, or surface plasma treatment, and prior to a metallization of the electron device's gate. Moreover, the fluorine treatment may be performed using the same lithography as a gate metallization. The method may comprise performing a recess etch before, after or during the fluorine treatment.

The fluorine treatment may shape the electric field's profile or distribution in the electron device in 1, 2, or 3 dimensions. The electric field's shaping may allow a reduction in a peak electric field in a channel of an electron device, which increases breakdown voltage and decreases gate leakage without harming the electron device's high-frequency performance.

The negatively-charged fluorine ions locally reduce an electron concentration in the electron device. The negatively-charged fluorine ions may partially deplete electrons in a region surrounding or adjacent where the fluorine treatment is performed, thereby causing a local increase in material resistivity and an increase in the electric field when current flows through the region surrounding or adjacent where the fluorine treatment is performed. The negatively-charged fluorine ions may be introduced below a gate of the electron device, in order to locally reduce charge density in a channel, increasing the electric field in that region. The negatively-charged fluorine ions may be introduced in a drain region, close to a gate of the electron device, in order to deplete a channel next to them, thereby expanding a drain-side depletion region and spreading out the electric field.

In addition, the negatively-charged fluorine ions may be introduced in the electron device to allow some of the electric field's lines, originating in positive charges of a depletion region, to terminate away from a gate of the electron device, thereby reducing a crowding of the electric field lines and decreasing the electric field peak.

The method may further comprise performing advanced electric field shaping in the electron device, by performing a plurality of the fluorine treatments with varying doses and energies in different regions of the electron device's structure.

Any electron device may be fabricated using this method, for example the electron device may be a Schottky diode or gate, and the negatively-charged fluorine ions increase a turn-on voltage of the Schottky diode or gate. For example, in a device comprising a gate length less than 0.2 microns, a breakdown voltage greater than 80 V may be achieved.

The present invention also discloses a method for passivating lattice defects, such as dislocations, point defects, interfaces, impurities or sidewalls, in an electron device, comprising performing a fluorine treatment to passivate the lattice defects. The passivating may enhance luminous efficiency and brightness of the electron device, enabling the fabrication of devices such as brighter and more efficient optoelectronic devices.

The present invention further discloses a method for reducing gate leakage currents in an electron device, comprising performing a fluorine treatment by introducing negatively charged fluorine ions into the electron device. A wide range of electron devices may also be fabricated using this method, such as nitride based devices, HEMTs, LEDs, lasers or detectors.

Furthermore, the present invention also envisages the general situation where the method for shaping an electric field in an electron device, comprises introducing fixed negative charge into the electron device to locally modify or shape the electric field's profile or distribution in the electron device.

The present invention also discloses a method for reducing a peak electric field in a semiconductor transistor, comprising introducing a controlled amount of dispersion into the semiconductor transistor, wherein the controlled amount of dispersion is small enough so that it does not harm the radio frequency (RF) frequency performance of the device.

The introducing of the controlled amount of dispersion may comprise introducing an unpassivated, or partially passivated gap, adjacent the semiconductor transistor's gate. The gap may be between the gate and a gate recess or passivation sidewall of the semiconductor transistor. The gap may have a width in the range 10-500 nm and comprise air or a non passivating, or partially passivating, dielectric or substance deposited in the gap. The gap may be introduced by (1) performing lithography of a foot of the gate, (2) depositing dielectric on the lithography, (3) removing the dielectric from the foot of the gate, but leaving the dielectric on one or more sidewalls, and (4) metallisation of the gate.

The introducing of the controlled amount of dispersion may comprise varying the semiconductor transistor's channel to surface distance, in a region adjacent the semiconductor transistor's gate. The varying may comprise changing the slope of a gate recess in the semiconductor transistor.

The method for introducing the controlled amount of dispersion may also comprise varying a thickness of a passivation layer, deposited on the semiconductor transistor, in a region adjacent the gate. The varying may comprise introducing a slope on a gate recess edge formed by the passivation.

The introducing of controlled amounts of dispersion may also comprise changing the degree of passivation in a drain access region of the semiconductor transistor, or introducing a dispersive dielectric adjacent the gate.

The introducing of controlled amounts of dispersion may increase a breakdown voltage, reduce a gate leakage current and increase an output power of the semiconductor device.

The present invention envisages a wide range of devices fabricated using this method, for example HEMTs, FETs, or nitride based devices. The amount of controlled dispersion is a trade off between reducing the peak electric field and minimizing a degradation of RF performance.

BRIEF DESCRIPTION OF THE DRAWINGS

Referring now to the drawings in which like reference numbers represent corresponding parts throughout:

FIGS. 5(a) and 5(b) are graphs, wherein FIG. 5(a) is a graph that illustrates a band diagram and charge distribution in the drain access region next to the gate, as a function of distance from the surface of a HEMT, where the negatively charged fluorine ions are represented by a negative sheet of charge ($-\sigma_F$), and FIG. 5(b) is a graph that illustrates an electric field profile in an AlGaN/GaN HEMT channel, with and without $F^-$ plasma treatment, by plotting electric field as a function of distance from the source along the channel.

FIGS. 11(a)-(d) are schematics showing the effect of surfaces states on reducing the drain current due to dispersion, wherein FIG. 11(a) shows gate bias $V_G$ and source drain current $I_{DS}$ pulses, and FIGS (b)-(d) are cross sectional schematics of a transistor under the various gate bias conditions of FIG. 11(a).

DETAILED DESCRIPTION OF THE INVENTION

Figure 1:
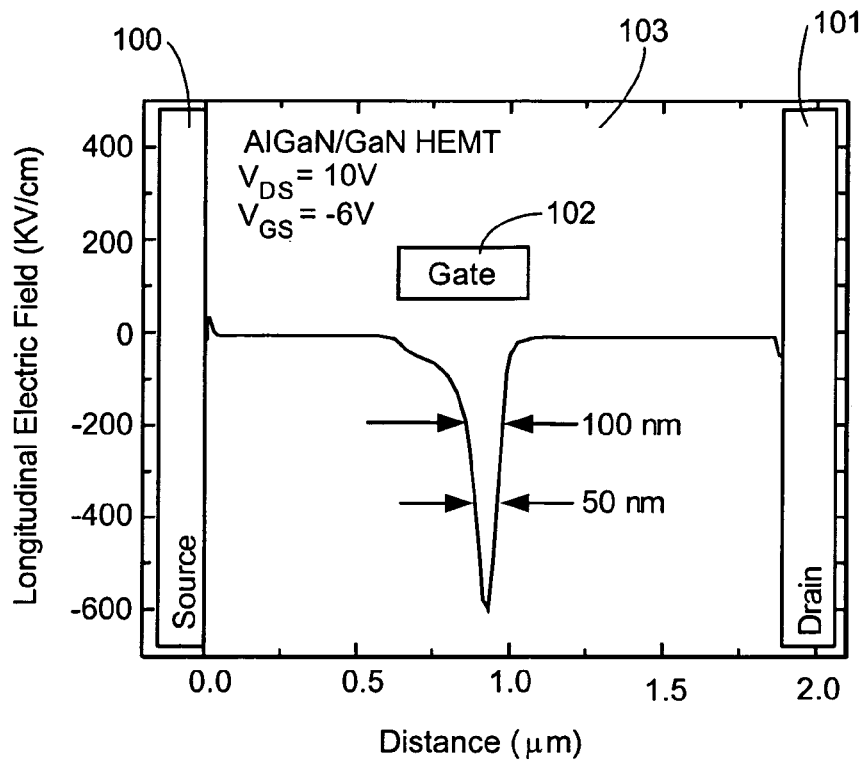
FIG. 1 is a schematic of a HEMT superimposed on a graph, where the graph illustrates the typical electric field profile in the channel of an AlGaN/GaN HEMT, by plotting the longitudinal electric field as a function of distance from the source along the channel.
Figure 2:
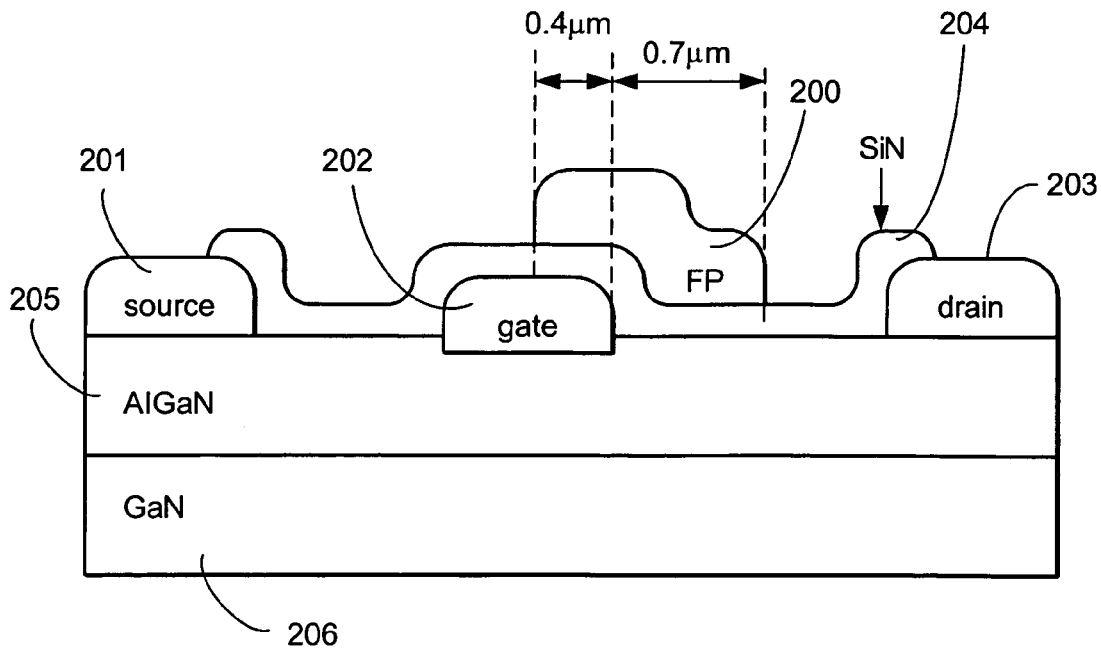
FIG. 2 is a schematic showing the cross sectional structure of an AlGaN/GaN HEMT, where a field plate structure (FP) has been used to reshape the electric field at the drain edge of the gate.
Figure 3:
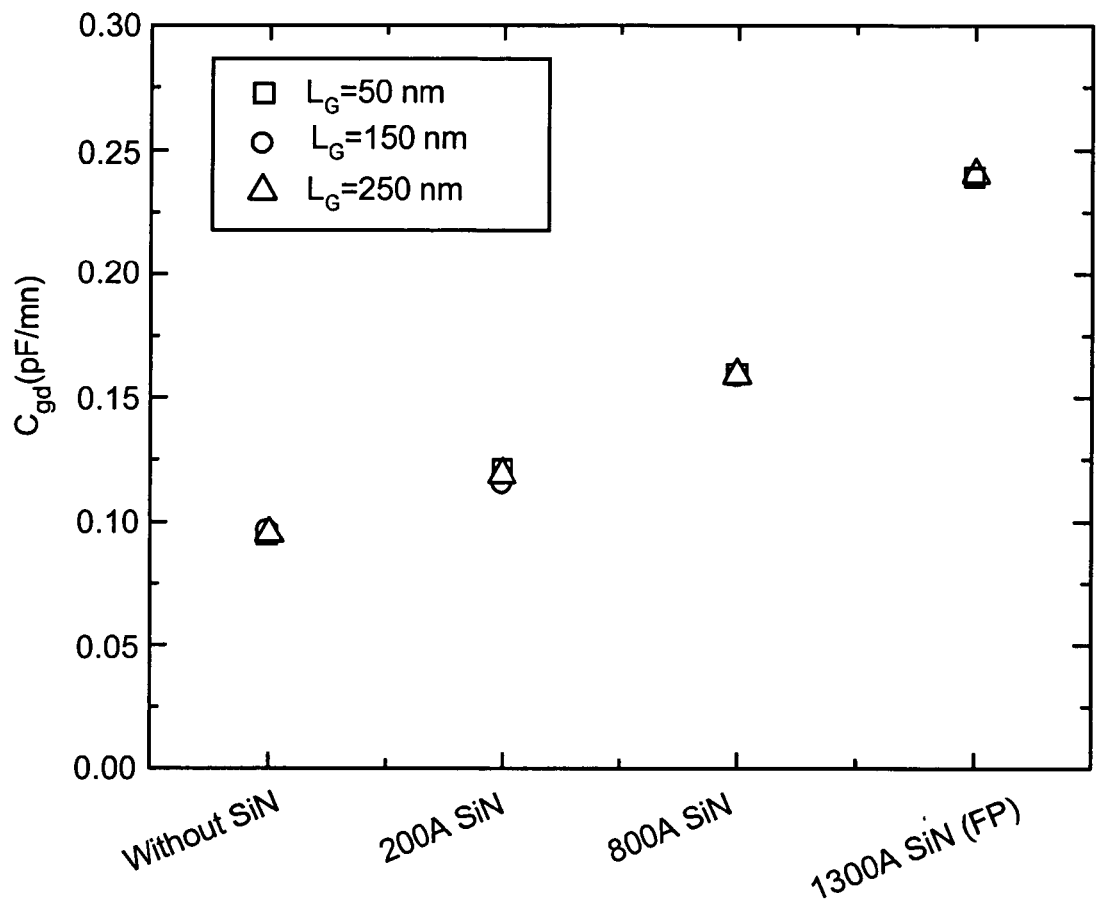
FIG. 3 is a graph showing the change in the parasitic capacitance $C_{GD}$ of an AlGaN/GaN HEMT, with a T-shape gate, under different passivation schemes.

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Overview

Treatments with fluorine compounds, including exposure to a plasma comprising fluorine containing compounds, have been used to locally reduce the electron concentration in nitride-based semiconductors, and shape the electric field profile in electron devices. The use of this electric field shaping technology, which can be employed in 1, 2, or 3-dimensional manner, in AlGaN/GaN HEMTs, allows a reduction in the peak electric field in the channel, which increases the breakdown voltage and decreases the gate leakage in these devices, without harming the high frequency performance of the transistor. Many other applications can be envisaged for the proposed fluorine treatment, such as high linearity devices or to increase in the effective electron velocity under the gate of AlGaN/GaN transistors.

The use of this fluorine treatment can also passivate lattice defects, such as dislocations, point defects or sidewalls, which also significantly reduces leakage currents, and enhances the luminous efficiency of optical devices, such as LEDs and lasers.

The following results have recently been demonstrated using the surface treatment:

(1) Breakdown voltages for deep submicron (gate length<0.2 μm) HEMTs in the range of 50-100 V or more, which is significantly higher than for conventional devices, where the breakdown voltage is less than 25 V for those gate lengths.

(2) At least 2 orders of magnitude lower gate leakage in the transistors.

(3) More than 0.5 V higher turn-on voltage in Schottky contacts.

(4) A new record in output power density at high frequencies (>10.5 W/mm @ 40 GHz) was achieved, due to the higher breakdown voltage, lower gate leakage and lack of damage introduced by the treatment. This value is more than a factor of 2 higher than the previous record.

The present invention also discloses methods to reduce gate leakage of the transistor, to increase the breakdown voltage of the transistor, and to increase the output power of the transistor, by introducing limited dispersion into the transistor. Different methods for introducing controlled amounts of dispersion in the transistor comprise:

(1) introducing a small gap between the gate metal and the passivation layer at the drain side of the gate, wherein the gap can be empty or filled up with any non-completely-passivating substance.

(2) Introduction of a slope in the gate recess of the transistor.

(3) Changing the thickness of the passivation layer in the drain access region.

(4) Changing the degree of passivation in the region adjacent to the gate, by processing of the gate region.

Fluorine Treatment to Modify the Electric Field Profile

The present invention uses negatively charged fluorine ions ($F^-$) to locally modify the electric field profile in electron devices, such as nitride based electron devices. This fluorine (F) treatment can be applied to the semiconductor by different techniques, for example implantation, thermal diffusion, surface plasma treatment, and the like. Due to the negative charge of these ions, the ions partially deplete the surrounding or adjacent semiconductor of electrons. The depletion causes a local increase in the material resistivity and an increase in the electric field when current flows through the depleted region. The depleted region may be in the channel of a HEMT, for example.

Figure 4:
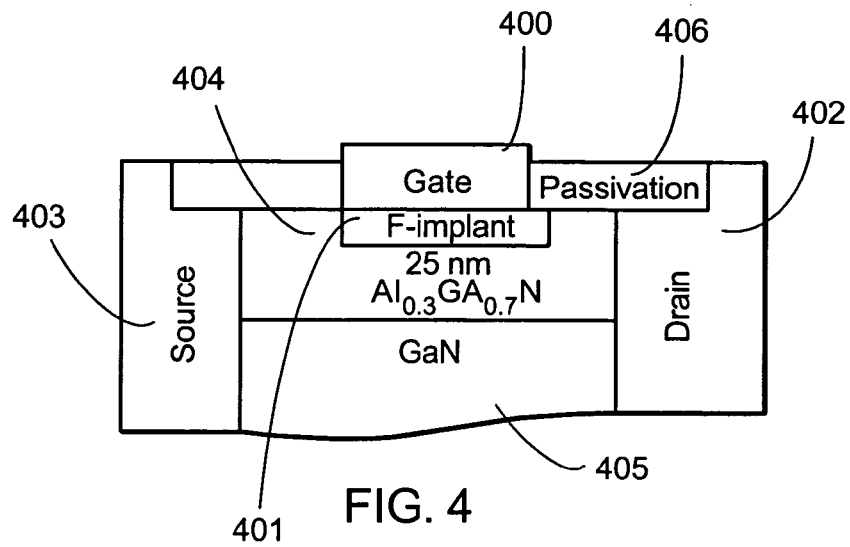
FIG. 4 is a block diagram that illustrates the cross sectional structure of an AlGaN/GaN HEMT, where a $CF_4/O_2$ plasma treatment has been used before the metallization of the gate, to introduce $F^-$ ions into the semiconductor below the gate contact.

FIG. 4, is a block diagram that illustrates the structure of an AlGaN/GaN HEMT, where a $CF_4/O_2$ plasma treatment has been performed before the metallization of the gate (400), to introduce $F^-$ ions (401) into the semiconductor below the gate contact (400). The HEMT of FIG. 4 also comprises a drain (402), source (403), AlGaN (404), GaN (405) and a passivation layer (406).

The present invention's ability to locally change the electric field distribution can substantially improve the performance of different kinds of electron devices, such as FETs, HEMTs, LEDs, lasers, and ultraviolet detectors.

For example, in a standard AlGaN/GaN HEMT, the electric field peaks at the drain side of the gate, so that the drain side of the gate constitutes the weak point through which the breakdown occurs due to impact ionization. The introduction of $F^-$ into the structure, just below the gate, locally reduces the charge density in the channel, increasing the electric field in that region. As the total voltage drop in the device has to be constant, the electric field at the drain side of the gate will decrease to compensate the increase under the gate. Therefore, the peak electric field in the structure is substantially reduced and the breakdown voltage increases.

Figure 5A:
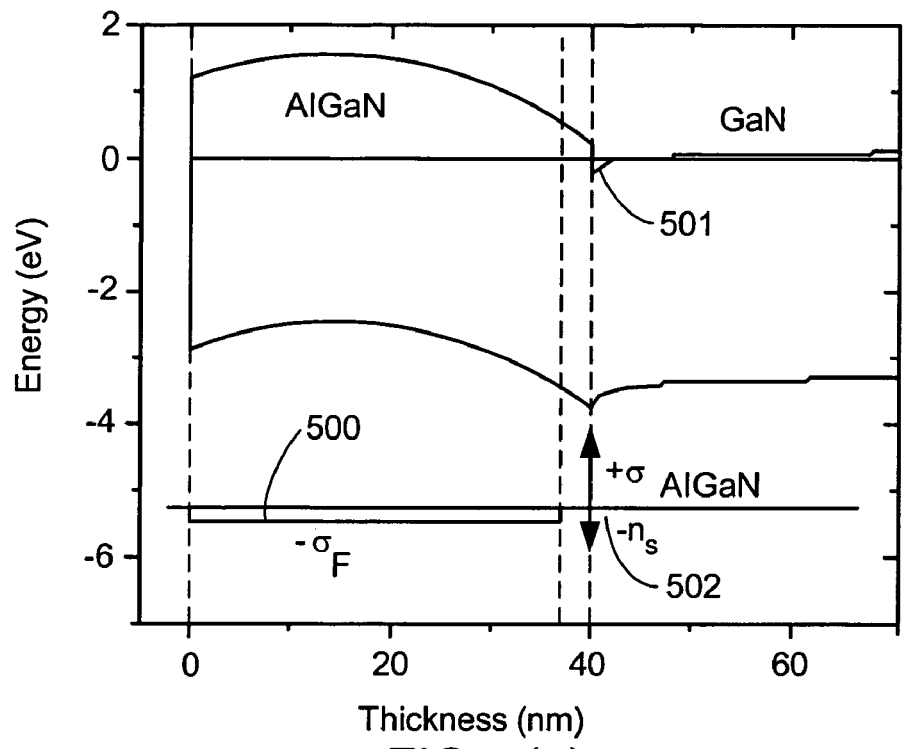
Figure 5B:
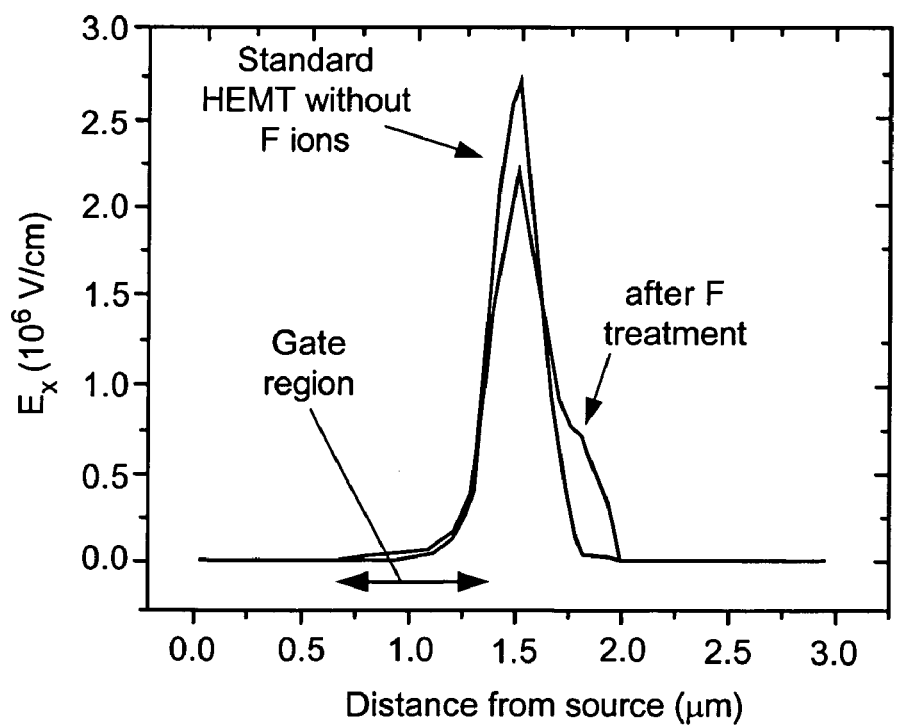

In a second example, illustrated in FIGS. 5(a) and 5(b), $F^-$ ions in the drain region close to, or adjacent the gate, deplete the channel next to them, expanding the drain-side depletion region and spreading out the electric field.

FIGS. 5(a) and 5(b) illustrate performing an F treatment on an electron device using $F^-$ ions to locally modify or shape the electric field's profile or distribution in the device. FIG. 5(a) is a graph that illustrates a band diagram and charge distribution, in the drain access region next to the gate, as a function of the distance from the device surface, and for a device treated with $F^-$ (500). The $F^-$ (500) are represented by a negative charge ($-\sigma_F$) that extends from the surface in the drain access region and ideally stops before the channel (501), however in some cases the negative charge can extend below the channel. The channel also comprises a negative sheet of charge $n_s$ (502).

FIG. 5(b) is a graph that illustrates an electric field profile in an AlGaN/GaN HEMT, with and without $F^-$ plasma treatment, thereby illustrating how using the $F^-$ may locally modify or shape the electric field's profile or distribution in the device. FIG. 5(b) shows how the peak electric field decreases and is spread out after the F plasma treatment, which will reduce the gate leakage and increase the breakdown voltage of the structure. FIG. 5(b) also shows the position of the gate.

Figure 6:
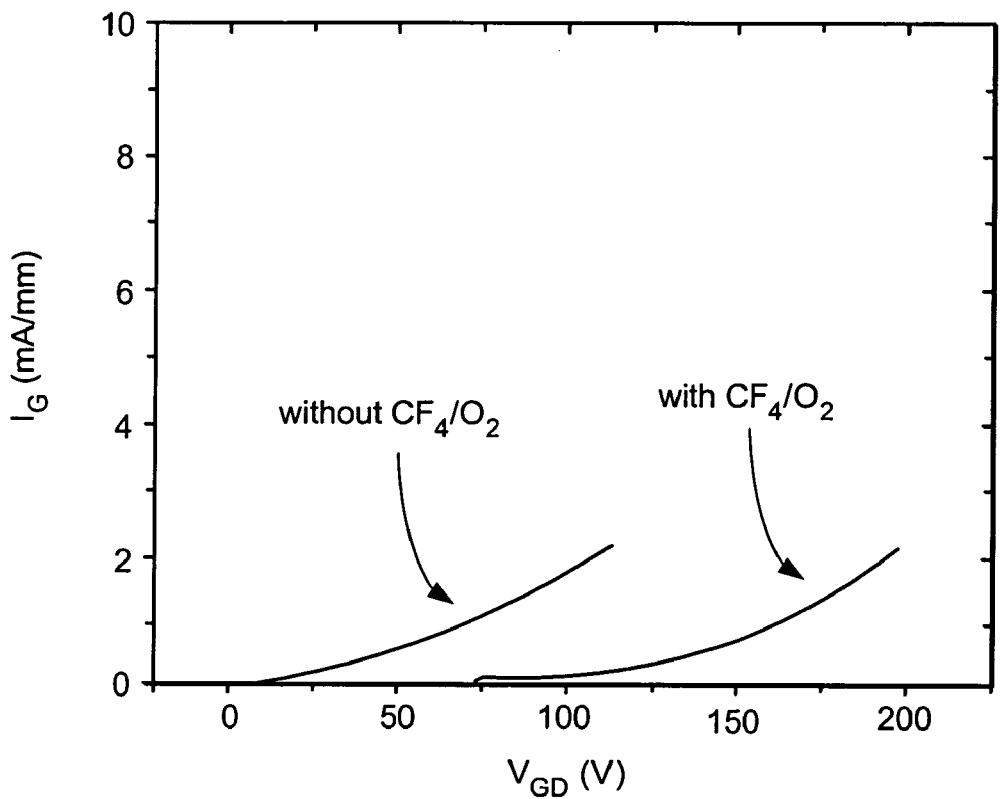
FIG. 6 is a graph that illustrates the effect of a $CF_4/O_2$ treatment on the breakdown voltage of AlGaN/GaN HEMTs, showing the gate leakage current $I_G$ as a function of the gate drain voltage $V_{GD}$, wherein a plasma treatment with $CF_4/O_2$ is one of the methods that can be used to introduce $F^-$ into the semiconductor.

FIG. 6 is a graph of gate current density $I_G$ as a function of gate-drain voltage $V_{GD}$, that illustrates the effect of a $CF_4/O_2$ treatment on the breakdown voltage of AlGaN/GaN HEMTs, wherein a plasma treatment with $CF_4/O_2$ is one of the methods that can be used to introduce $F^-$ into the semiconductor. The breakdown is evidenced by an increase in $I_G$ as $V_{GD}$ is increased. FIG. 6 shows that, with $F^-$ treatment, $V_{GD}$ can be increased to higher voltages (at least 65 V) before the gate starts to draw too much current $I_G$, compared to the situation without $F^-$ treatment. The $F^-$ treatment therefore increases the breakdown voltage compared to the non F treatment.

As a third way of reducing the electric field peak, in a transistor under saturation, the introduction of fixed negative charges in the device allows some of the electric field lines originating in the positive charges of the depletion region to terminate away from the gate. For example, in FIG. 4, the F implantation (401) could be positioned anywhere away from the gate (400), so that electric field lines from the positive charges in the depletion region terminate on the negative charges of the implantation (401). With properly designed implantation profiles, this effect can reduce the crowding of the electric field lines, thus decreasing the electric field peak.

The electric field shaping performed by F treatment presents multiple advantages with respect to other competing technologies, such as the use of field plated structures and multiple recesses.

Unlike field plating techniques, the proposed method of using F to shape the electric field does not introduce parasitic capacitances in the device. Therefore, it is much better suited than the field plate technology for high frequency devices [5,6].

Moreover, the basic F implantation technology is simpler. For example, in a transistor, F can be introduced in a self-aligned manner with the gate, by using the same lithography that defines the gate metal. Furthermore, the F can be introduced immediately before, after, or during the gate recess process, in the same dry etch system. On the other hand, in the case of field plates, at least one additional lithography and metal evaporation process step is required.

The use of multiple recesses to reduce the peak electric field and to improve the breakdown voltage also shows multiple disadvantages when compared to the proposed F treatment technique. The main idea behind using multiple recesses to increase the breakdown voltage of the devices, is to reduce the charge density in the drain access region of the transistor [3,4].

However, the recess technique has the drawback of introducing parasitic resistances that will harm the frequency performance of the device. Also, the use of recesses in the access region decreases the distance between the channel and the surface of the semiconductor. This is likely to introduce dispersion in nitride-based devices, due to the higher effect of surface traps when they are close to the channel. Another problem of multiple recesses is that the dry etch induces damage into the semiconductor that significantly increases the gate leakage of the devices. None of the above-mentioned problems are present in the proposed F-based technology.

The increase in breakdown voltage is not the only advantage of the electric field shaping capability of F implantation. The reduction of the peak electric field in the device also causes a reduction in the tunneling current flowing from the drain towards the gate contact.

Figure 7:
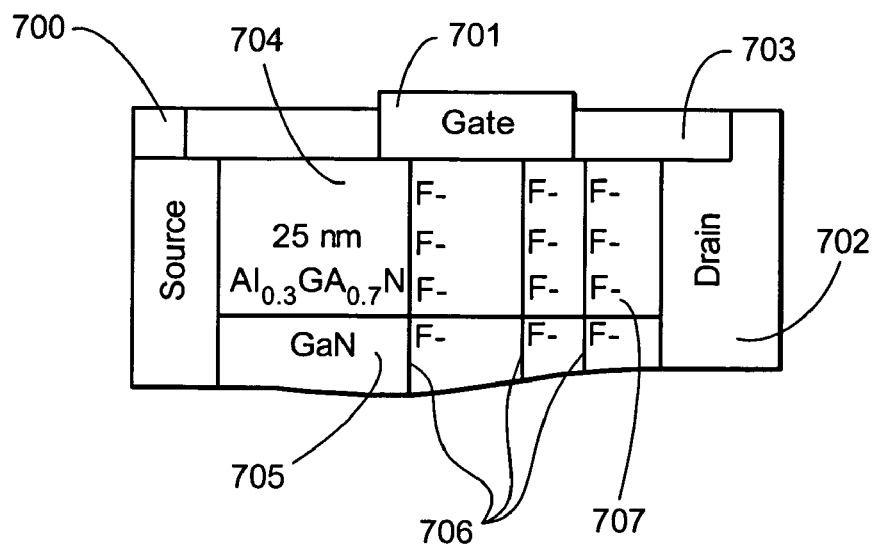
FIG. 7 is a block diagram of the cross section of an electron device, that illustrates how the proposed fluorine treatment can be use to passivate dislocations (sketched on the figure), sidewalls and point defects.

In addition, the F treatment can passivate leakage, for example gate leakage, and recombination paths through dislocations and sidewalls, as shown in FIG. 7. FIG. 7 is a block diagram, showing the cross section of an electron device, comprising a source (700), gate (701), drain (702), passivation layer (703), AlGaN layer (704), GaN layer (705), dislocations (706), and F ions (707). FIG. 7 illustrates how the proposed F treatment (707) can be used to passivate dislocations (706), sidewalls and point defects.

The F treatment can also be used to passivate interface and point defects as well as impurities. This kind of passivation is beneficial for both electronic and optoelectronic devices. The defect passivation in optoelectronic materials will enhance the luminous efficiency of the optical devices, enabling the fabrication of brighter and more efficient light emitting diodes, lasers, and other light emitting optoelectronic devices.

Figure 8:
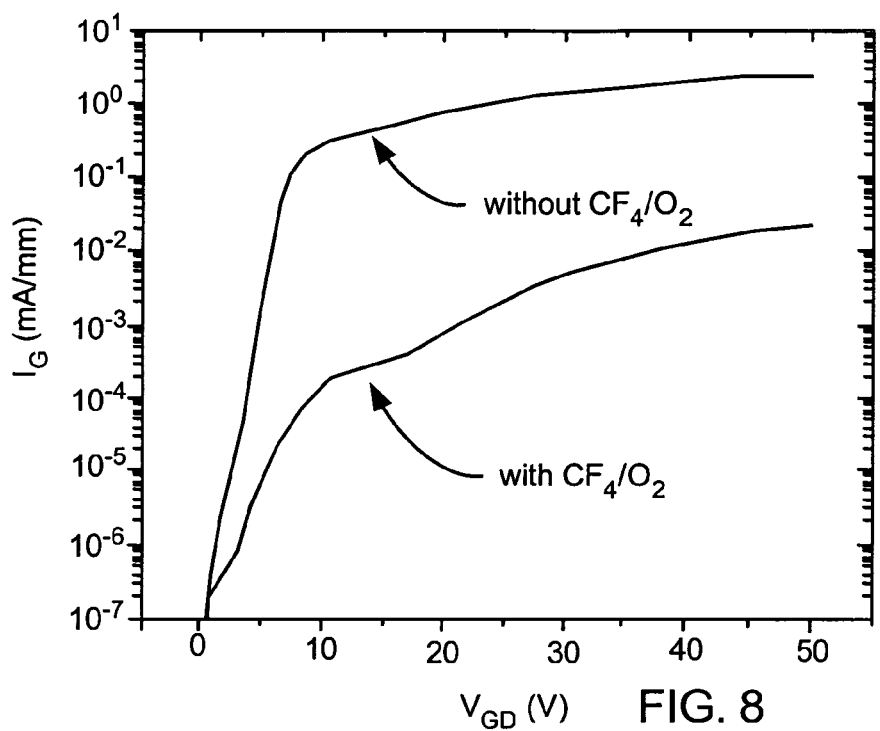
FIG. 8 is a graph of $I_G$ as a function of $V_{GD}$ that illustrates the effect of a $CF_4/O_2$ treatment on the gate leakage of AlGaN/GaN HEMTs.

More than 1 order of magnitude lower gate currents are typically obtained in $F^-$ treated HEMTs as compared to standard devices. FIG. 8 is a graph that illustrates the effect of a $CF_4/O_2$ treatment on the gate leakage of AlGaN/GaN HEMTs, i.e. the F treatment reduces the gate leakage current.

The fluorine treatment also increases the maximum positive gate voltage that can be applied to an AlGaN/GaN HEMT, before getting a significant gate current. For high frequency devices, the use of F implantation instead of metal-insulator-semiconductor (MIS) below the gate, to reduce gate leakage, has the advantage of not increasing the gate to channel distance or introducing parasitic capacitances.

Figure 9:
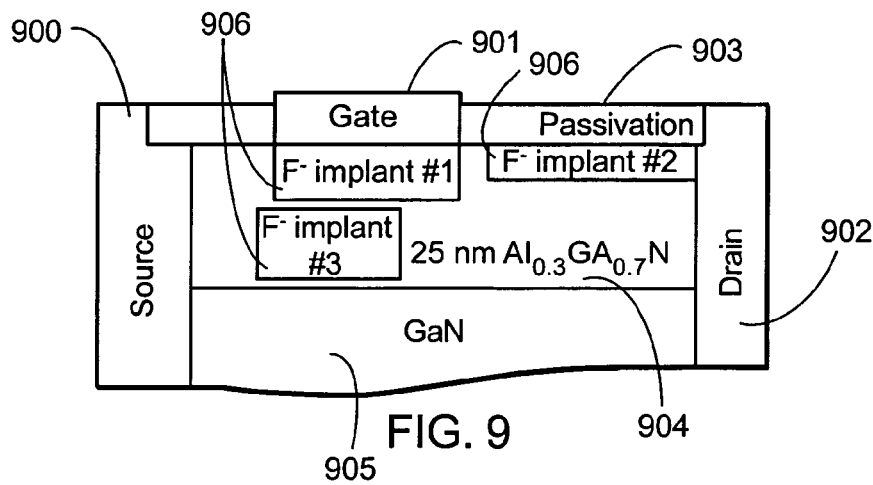
FIG. 9 is a block diagram that illustrates the cross-sectional structure of an AlGaN/GaN HEMT with multiple fluorine implantations, wherein multiple fluorine compound exposures (for example, by fluorine implantations) can be performed in the same device to engineer the electric field and ion distributions.

Advanced electric field shaping can be envisaged where multiple F treatments are performed, with varying dose and energy in different regions of the device structure, as shown in FIG. 9. FIG. 9, is a block diagram that illustrates the cross-section structure of an AlGaN/GaN HEMT, comprising a source (900), gate (901), drain (902), passivation (903), AlGaN layer (904), GaN layer (905) and multiple $F^-$ implantations (906). Thus, multiple F compound exposures, for example, by F implantations (906), can be performed in the same device to engineer the field and ion distributions. With this advanced junction termination technology, the devices can be optimized for high voltage performance, linearity, electron velocity, or other device parameters affected by this treatment.

As an example, the F treatment can be used to increase the linearity of AlGaN/GaN HEMTs, by performing a blank exposure of the drain access region. The exposure of the drain access region to F will change the electric field in the drain access region with respect to the electric field in the source access region, and that will delay the quasi-saturation of the electron velocity in the source access region, thereby increasing the linearity of the device [7].

In another example, multiple $F^-$ implantations can be performed below the gate, to increase the electric field in this region, and maximize the effective electron velocity in the device.

Figure 10:
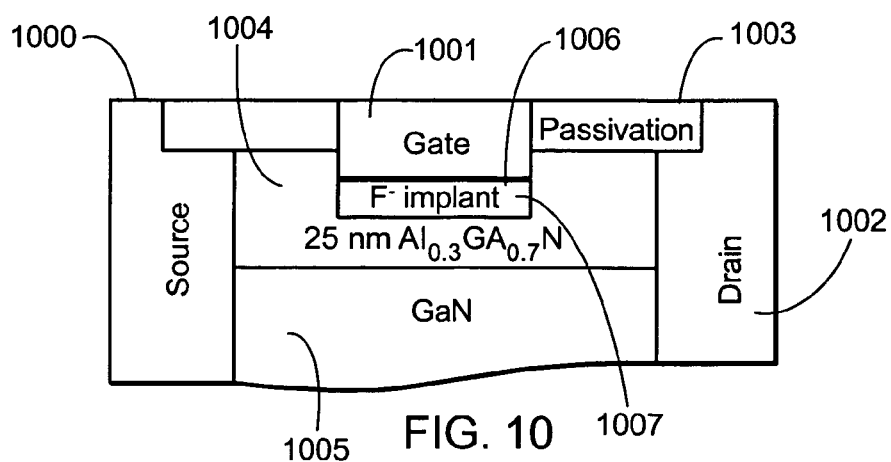
FIG. 10 is a block diagram that illustrates the cross section of an AlGaN/GaN HEMT, wherein the fluorine treatment has been used in combination with a recess etch under the gate.
Figure 11A:
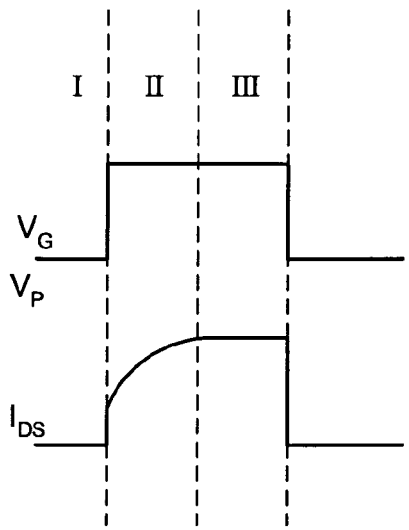
Figure 11B:
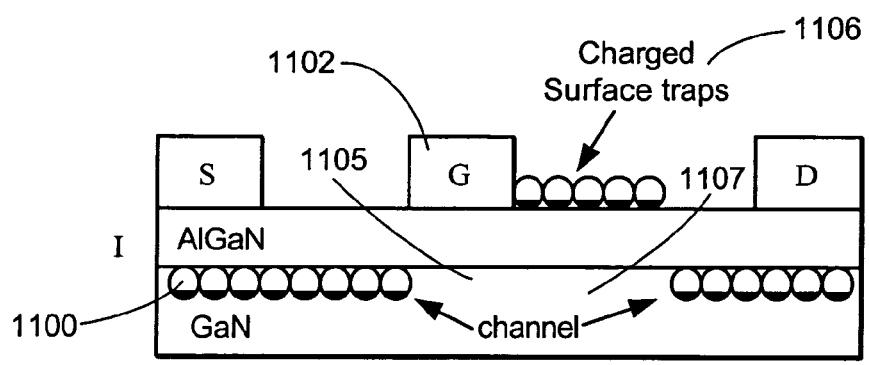
Figure 11C:
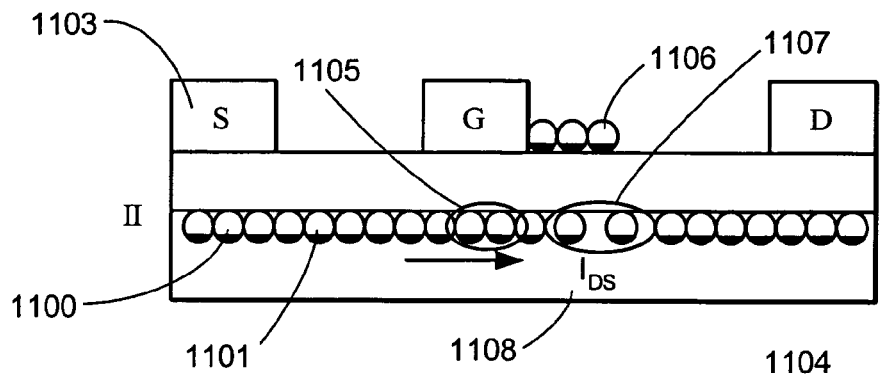
Figure 11D:
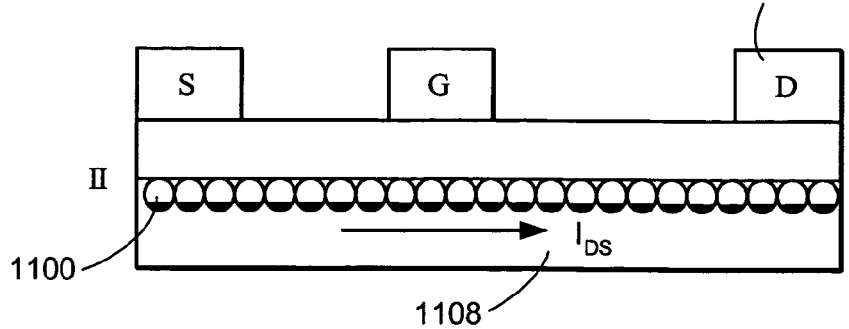

The proposed F treatment can also be combined with recess etches. FIG. 10 is a block diagram that illustrates the cross section of an AlGaN/GaN HEMT, comprising a source (1000), gate (1001), drain (1002), passivation (1003), AlGaN layer (1004), GaN layer (1005) and $F^-$ ion implant (1006), wherein the F treatment (1006) has been used in combination with a recess etch (1007) under the gate. In this case, the F treatment can be applied before, after or during the recess etch.

When designing advanced electric field profiles with the proposed F treatment, for a material (such as AlGaN), it is important to consider the effect of the polarization-induced electric fields of the material, taking into account the final distribution of F ions in the material. This electric field can be as high as a few MV/cm in nitride-based devices, such as AlGaN/GaN HEMTs, and it can significantly affect the drift of F ions, enhancing the F diffusion inside the semiconductor.

In conclusion, the use of F treatment allows an extremely high degree of flexibility in the electric field profiling, and junction termination engineering, of electron devices. It has been proven to significantly reduce the gate leakage and increase the breakdown voltage of AlGaN/GaN HEMTs. However, many other applications can be envisioned in different devices, where multiple treatments are performed to obtain, for example, a 1, 2 or 3-dimensional electric field profiling, reduced gate leakage and enhanced Schottky barrier. For example, the electron device may comprise a Schottky diode or gate and the negatively-charged fluorine ions increase a turn-on voltage of the Schottky diode or gate. Moreover, materials other than F can be used to introduce fixed charge into the electron device to locally modify the electric field profile. In general, the fixed charge may be introduced at a location which is adjacent to the region where the electric field should be increased, at a distance sufficient to partially deplete the charges in that region. The charge distribution may be 3-dimensional. It should be noted that the introduction of Fluorine ions into the device is different from standard semiconductor doping, because, in standard semiconductor doping, the ionized dopant ion is compensated by a mobile electron or hole. In the case of fluorine treatment, all the charge introduced in the system due to the Fluorine ion is fixed and it does not contribute to the current.

Use of Dispersion to Reduce Peak Electric Field.

Normally, dispersion is an important undesired phenomenon in field effect transistors having a large number of surface states, such as nitride-based devices. Dispersion is characterized by a decrease in the drain current, under large signal operation at high frequency.

An illustration of how surface-states can cause dispersion is shown in FIGS. 11(*a*),(*b*) (*c*) and (*d*). FIG. 11(*a*) is a graph of the gate voltage ($V_G$) and source drain current ($I_{DS}$) pulses as a function of time, and sliced into regions I, II and III. FIGS. 11(*b*),(*c*) and (*d*) are schematics showing the charge (1100) in a device comprising a channel (1101), gate (1102), source (1103) and drain (1104), for the various $V_G$ and $I_{DS}$ levels in regions I, II and III illustrated in FIG. 11(*a*).

In region I of FIG. 11(*a*), a negative voltage below pinch-off is applied to the gate. The resulting charge (1100) distribution in the device, for this bias condition, is illustrated in FIG. 11(*b*). The region (1105) of the channel under the gate is depleted and the device is off. Due to the high electric field at the drain edge of the gate, there is a small amount of gate leakage between the gate (1102) and drain (1104). This current charges up the surface states (1106), forcing the surface potential to become negative. As a result, the region (1107) of the channel under this part of the drain access region next to the gate (1102) is depleted too.

In region II of FIG. 11(*a*), the gate bias changes towards positive very quickly. The resulting charge (1100) distribution in the device, for this bias condition, is illustrated in FIG. 11(*c*). The region (1105) of channel under the gate can follow the quick change and turns on almost instantly. However, the situation under the drain access region is different. Due to the slow response of the deep level traps, or low mobility of the electrons along the surface (1106), the region (1107) of channel region underneath the drain access region cannot turn on immediately after the gate bias becomes more positive. Instead, this region (1107) is still depleted or has very low carrier concentration immediately following the gate bias change. This results in a highly resistive region and a substantial portion of the drain bias drops across it. Therefore, the drain current remains (1108) low just after changing the gate bias. As the electrons (1100) are released from the traps (1106) and move back to the gate or drain gradually, the carrier concentration in the region (1107) of channel under the drain access increases correspondingly and the drain current (1108) increases as well.

If the pulse is long enough, the drain current (1108) reaches the steady-state value, as shown in region III of FIG. 11(*a*). The resulting charge (1100) distribution in the device, for this bias condition, is illustrated in FIG. 11(*d*). Normally, the effect of the dispersion is minimized by depositing a passivating dielectric on the surface of the semiconductor. The dielectric will prevent the electrons (1100) from the gate reaching the surface states and therefore reduce their parasitic gating effect.

Some of the effects of dispersion in the devices are (1) a reduction of the maximum current under pulsed gate conditions, due to the longer time response of the traps and the gating effect of the dispersion, (2) an increase of the knee voltage of the device, due to the increase in the access resistance, (3) a reduction of the gate leakage current, due to the decrease in the peak electric field, and finally, (4) a decrease in electric field also produces an increase in the breakdown voltage of the devices [9].

In the proposed invention, the breakdown voltage of the transistors is increased due to the introduction of controlled amount of dispersion into the device. This dispersion is large enough to reduce the peak electric field in the channel, but low enough in order not to cause a significant decrease in the output power of the device (i.e. less than 20% power degradation).

In our design, the whole transistor is passivated against dispersion, with the exception of a small region of 20 to 500 nm wide immediately next to the drain side of the gate. In this region, a limited amount of dispersion is introduced, to increase the breakdown voltage of the device, by spreading the high electric field to this region.

Figure 12:
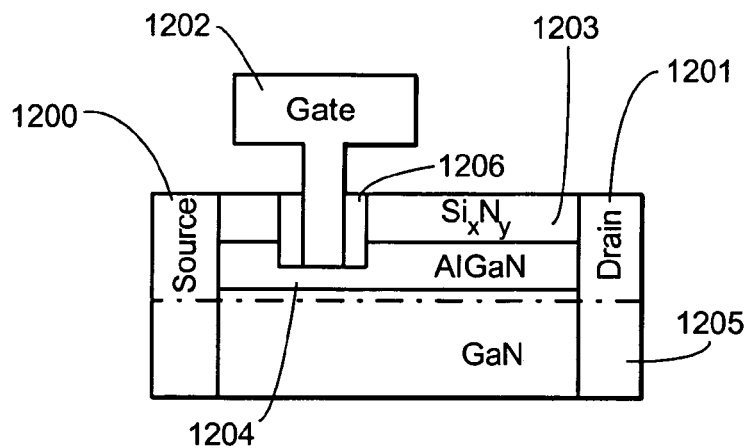
FIG. 12 is a cross sectional schematic of a transistor, wherein a limited amount of dispersion is introduced next to the drain edge of the gate, by leaving a gap of unpassivating material.
Figure 13:
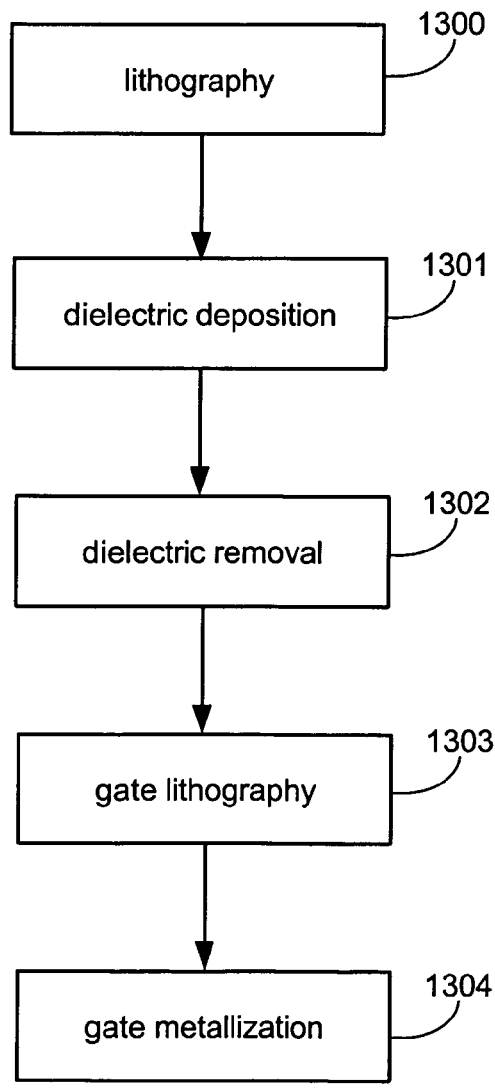
FIG. 13 is a flowchart illustrating the method for introducing an unpassivated gap into a transistor.
Figure 14A:
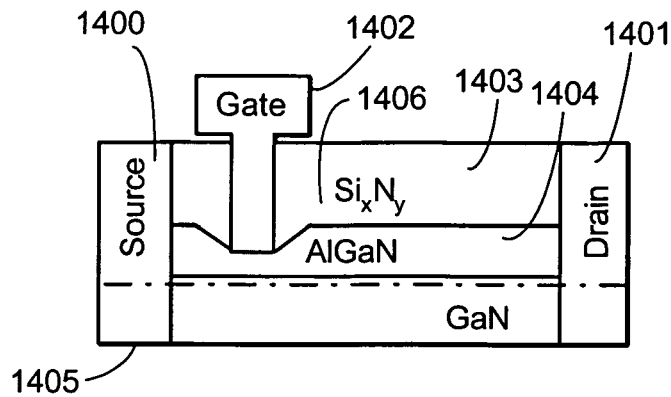
FIGS. 14(a) and (b) are schematic cross-sections of a transistor, where the distance between the surface and the channel is reduced next to the gate, to introduce dispersion that will reduce the electric field in that region.
Figure 14B:
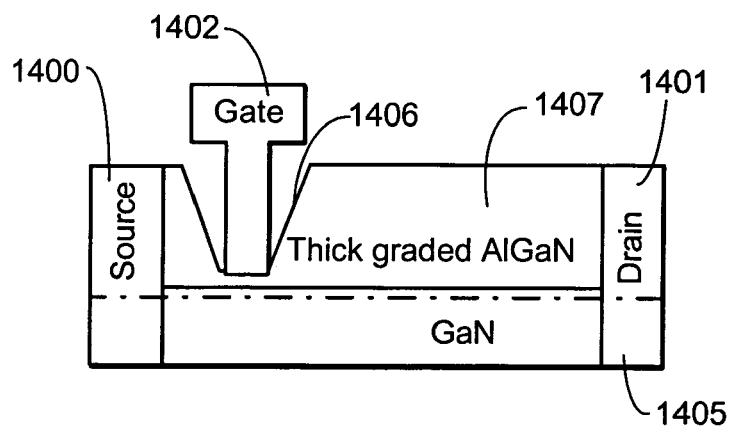

Within the present invention, three different techniques, illustrated in FIGS. 12, 13 and 14, are proposed to introduce limited, or controlled, amounts of dispersion in semiconductor transistors, which techniques will reduce the peak electric field in the FET and increase the breakdown voltage while keeping the RF output power and efficiency almost constant.

The first technique comprises the introduction of a small unpassivated, or partially passivated gap, adjacent the transistor's gate, for example, between the gate metal and the recess (or passivation) sidewall, as shown in FIG. 12. The HEMT of FIG. 12, a comprises a source (1200), drain (1201), gate (1202), SiN passivation (1203), AlGaN layer (1204), GaN (1205), non passivating sidewall(s) or gaps (1206). This gap (1206) can be filled up with air or any other non-passivating, or partially pasivating dielectric or substance. The non passivating dielectric may be a thin (for example, 200 Angstrom thick) sidewall comprising, for example, silicon dioxide or amorphous silicon. Using the different sidewall techniques widely known in the literature, the thickness of this gap can be accurately controlled. An example of the process flow, illustrated in FIG. 13, that could produce the above mentioned gap comprises:

1. Block 1300 representing the step of E-beam lithography of the foot of the gate of the transistor.
2. Block 1301 representing the step of deposition of dielectric, such as 50 nm of $SiO_2$, on the transistor surface. It is important that this layer does not passivate the surface.

3. Block 1302 representing the step of removing, for example by dry etching, the dielectric, such as $SiO_2$, from the foot of the gate, but leaving the dielectric on the sidewalls.
4. Block 1303 representing the step of Ebeam lithography to define the top of the gate.
5. Block 1304 representing the step of metallisation of the gate.

It should be noted that the above process flow is provided only as an example, and the process flow can change.

The second technique takes advantage of the fact that, the effectiveness of surface traps in depopulating the channel is inversely proportional to the surface to channel distance [10]. The amount of dispersion in a transistor can be controlled by varying the channel-to-surface distance in the region close to, or adjacent the gate, as illustrated in FIGS. 14(*a*) and 14(*b*).

FIGS. 14(*a*) and 14(*b*) are schematic cross sectional views of a HEMT comprising a source contact (1400), drain contact (1401), gate (1402), passivation (comprising for example SiN) (1403), AlGaN (1404), and GaN (1405). FIGS. 14(*a*) and 14(*b*) show how, by changing the slope (1406) of the gate recess, or by doing selective recesses next to the drain side of the gate, the dispersion at each point of the channel can be controlled. FIG. 14(*b*) shows how this approach can also be used in samples where epitaxial passivation in the form of a thick graded AlGaN (1407), such as the one described in [10], has been used.

The third method proposed under the present invention is based on a passivation thickness' effectiveness in removing dispersion. For example, in GaN-based HEMTs with a SiN passivation layer deposited by PECVD, SiN thicknesses larger than 80 nm have been proven to passivate the surface successfully (this thickness value is only given here as an example, as it is strongly technology dependent).

Figure 15:
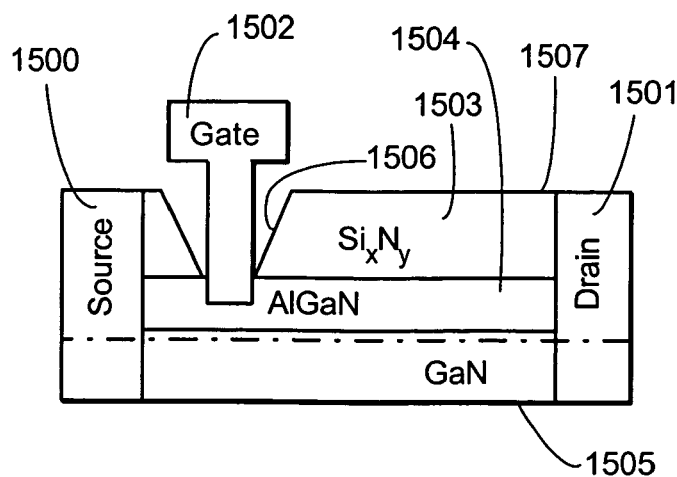
FIG. 15 is a schematic cross section of a transistor, where the thickness of the passivating layer next to the gate is reduced to reduce its effectiveness in removing dispersion.

However, thinner SiN layers will still allow some degree of dispersion. In this third method, the thickness of the passivation in the region next to, or adjacent the gate is changed, as shown in FIG. 15, in order to introduce dispersion in that region. FIG. 15 illustrates a HEMT comprising a source contact (1500), drain contact (1501), gate (1502), passivation (comprising for example SiN) (1503), AlGaN (1504), GaN (1505), and a slope (1506) on the gate recess edge formed by the passivation (1503). Alternatively, the thickness of the passivation can be changed in the drain access region (1507) of the HEMT.

The effectiveness of the passivation can also be locally changed by modifying the passivation layer near the gate through chemical etching or other treatment like physical damage.

The result of all these four techniques is a limited amount of unpassivated surface states next to the drain edge of the gate. Under large signal conditions, these states will be filled up by electrons from the gate, and will partially deplete the channel underneath. The reduction in the electron density of the channel will cause an increase in its resistance, and a larger voltage drop in that region, which will produce an increase in the electric field in the channel under the drain side of the gate. By changing the width of the unpassivated region, the maximum extension of the electric field may be controlled. As the area integral of the electric field is equal to the voltage drop, and the total applied voltage is constant, the increase in the electric field due to dispersion will cause a reduction in the peak electric field under the gate. As previously discussed, reducing this electric field will produce an increase in the breakdown voltage. In this way, the output power of the device can be increased.

It is important to note that the proposed invention does not have a significant impact on the high frequency performance of the transistor. From the RF point of view, the unpassivated region does not significantly affect the high frequency response of the device. This is because the traps associated with the dispersion have a very long response time and they cannot follow the applied RF signal. Therefore, the channel underneath the unpassivated region with dispersion will not be modulated by the gate. Thus, the degradation in the high frequency performance will only be limited to a small increase in the drain access depletion region which has a width, for example, of 10-200 nm. There, in the drain access depletion region, the electrons have a very high velocity, and consequently, the associated transit delay will be low. If properly designed, the reduction in frequency performance will be less than 30%.

The width of the region adjacent the gate with dispersion (i.e., the drain access depletion region), which determines the amount of dispersion introduced, should minimize a transit delay and minimize a degradation of frequency performance. Consequently, the amount of dispersion introduced is a trade-off between the desired reduction in electric field and an acceptable degradation in RF performance.

Possible Modifications

The present invention, illustrated in FIGS. 12-15, can be applied to any kind of semiconductor transistor, such as a FET, for example, HEMTs, MOSFETs, MESFETs, made of any semiconductor family. Furthermore:

1. Different processing techniques can be used to correctly shape the recess sidewalls.
2. Different processing techniques can be used to introduced a gap between the metal gate and the semiconductor.
3. Different materials can be used to fill up or coat the recess sidewalls.
4. In transistors without native surface states, the dispersion can be introduced by a dispersive dielectric next to the gate.
5. It may be possible to combine the different techniques presented in this work in a single device.
6. The gate metal can be in contact with the passivating layer Advantages and Improvements Over Existing Practice Many of the novel features of the present invention have been detailed in this disclosure. The key points identified in the overview section constitute the most critical and novel elements in the design on transistors with high output power at very high frequencies. The present invention significantly increases the breakdown voltage of HEMT and MESFET transistors. However, in contrast to other methods currently in use, the introduced parasitic capacitances are kept to a minimum. This is one of the main advantages with respect to other methods of improving the breakdown voltage. This allows the operation of the proposed transistors at a higher frequency.

REFERENCES

The following references are incorporated by reference herein:

[1] European patent publication No. EP 186,058, by Pfleiderer Hans-Jorg Dr., entitled "Field effect transistor with a high voltage breakdown capacity, and method for its production", published on July 1986.
[2] U.S. Pat. No. 5,084,743, issued Jan. 28, 1992, to Mishra et al., entitled "High current, high voltage breakdown field effect transistor."
[3] Japanese patent application No. 62-19897, by Saito, published on Aug. 3, 1988.

[4] Furutsuka et al., "Improvement of the Drain Breakdown Voltage of GaAs Power MESFETs by a Simple Recess Structure," IEEE Trans. On Electron Dev. 6, 563 (1978).

[5] A. Chini, D. Buttari, R. Coffie, L. Shen, S. Heikman, A. Chakraborty, S. Keller, and U. K. Mishra, "Power and Linearity characteristics of field-plated recessed-gate AlGaN—GaN HEMTs," Electron Dev. Lett., 25, 229 (2004).

[6] H. Xing, Y. Dora, A. Chini, S. Heikman, S. Keller, and U. K. Mishra, "High breakdown voltage AlGaN—GaN HEMTs achieved by multiple field plates," Electron Dev. Lett. 25, 161 (2004).

[7] T. Palacios, S. Rajan, A. Chakraborty, S. Heikman, S. Keller, S. P. DenBaars, and U. K. Mishra, "Influence of the Dynamic Access Resistance in the $g_m$ and $f_T$ linearity of AlGaN/GaN HEMTs," IEEE Trans. On Electron Dev. Vol. 52, pp. 2117-2123 (2005).

[8] Y. Cai, Y. Zhou, K. J. Chen, and K. M. Lau, "High-Performance Enhancement-Mode AlGaN/GaN HEMTs Using Fluorine-Based Plasma Treatment," IEEE Electron Device Letters, vol. 26, no. 7, pp. 435-437 (2005).

[9] R. Vetury, N. Q. Zhang, S. Keller, and U. K. Mishra, "The impact of surface states on the DC and RF characteristics of AlGaN/GaN HFETs," IEEE Trans. Electron. Dev., Vol. 48, no. 3, pp. 560-566, March 2001.

[10] L. Shen, R. Coffie, D. Buttari, S. Heikman, A. Chakraborty, A. Chini, S. Keller, S. P. DenBaars, and U. K. Mishra, "High-power polarization-engineered GaN/AlGaN/GaN HEMTs without surface passivation", Electron Dev. Lett. 25, 7 (2004).

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A method for shaping an electric field in an electron device, comprising:
   performing a fluorine treatment on the electron device using negatively-charged fluorine ions to locally modify or shape the electric field's profile or distribution in the electron device, wherein:
   the electron device includes a gate and a drain on a semiconductor material having a surface, a portion of the surface being between the gate and the drain but not directly under the gate;
   the negatively-charged fluorine ions are introduced in the electron device to allow some of the electric field's lines to terminate away from the gate of the electron device, thereby reducing a crowding of the electric field lines and decreasing an electric field peak, and
   the negatively-charged fluorine ions are introduced in a region of the electron device that is directly under the portion of the surface.

2. The method of claim 1, wherein the semiconductor material comprises GaN or AlGaN.

3. The method of claim 1, wherein the electron device is a high electron mobility transistor (HEMT).

4. The method of claim 3, wherein the negatively-charged fluorine ions are a negative charge that extends from a surface of the HEMT and stops before a channel of the HEMT or extends below the channel of the HEMT.

5. The method of claim 1, wherein the fluorine treatment is performed by implantation, thermal diffusion, or surface plasma treatment.

6. The method of claim 1, wherein the fluorine treatment is performed prior to a metallization of the electron device's gate.

7. The method of claim 1, wherein the electric field's shaping allows a reduction in the electric field peak in a channel region of the electron device.

8. The method of claim 1, wherein the negatively-charged fluorine ions partially deplete electrons in a region surrounding or adjacent where the fluorine treatment is performed.

9. The method of claim 1, wherein the negatively-charged fluorine ions are introduced below the gate of the electron device.

10. The method of claim 1, further comprising performing a plurality of the fluorine treatments with varying doses and energies in different regions of the electron device's structure.

11. The method of claim 1, further comprising performing a recess etch before, after or during the fluorine treatment.

12. The method of claim 1, wherein the gate length of the electron device is less than 0.2 microns, and a breakdown voltage of the electron device is greater than 50 V.

13. The method of claim 3, wherein the negatively-charged fluorine ions increase a turn-on voltage of the gate of the HEMT.

14. A method for shaping an electric field in an electron device, comprising:
   introducing fixed negative charge into the electron device to locally modify or shape the electric field's profile or distribution in the electron device, wherein:
   the electron device includes a gate and a drain on a semiconductor material having a surface, a portion of the surface being between the gate and the drain but not directly under the gate;
   the fixed negative charge is introduced in the electron device to allow some of the electric field's lines to terminate away from a gate of the electron device, thereby reducing a crowding of the electric field lines and decreasing an electric field peak, and
   the fixed negative charge is introduced in a region of the electron device that is directly under the portion of the surface.

15. The method of claim 14, wherein the semiconductor material comprises GaN or AlGaN.

16. The method of claim 14, wherein the electron device is a high electron mobility transistor (HEMT).

17. The method of claim 16, wherein the fixed negative charge increases a turn-on voltage of the gate of the HEMT.

18. The method of claim 14, wherein the fixed negative charge extends from a surface of the HEMT and stops before a channel of the HEMT or extends below the channel of the HEMT.

19. The method of claim 14, wherein the fixed negative charge is introduced by implantation, thermal diffusion, or surface plasma treatment.

20. The method of claim 14, wherein the fixed negative charge is introduced prior to a metallization of the electron device's gate.

21. The method of claim 14, wherein the electric field's shaping allows a reduction in the electric field peak in a channel region of the electron device.

22. The method of claim 14, wherein the fixed negative charge partially depletes electrons in a region surrounding or adjacent where the fixed negative charge is introduced.

23. The method of claim 14, wherein the fixed negative charge is introduced below the gate of the electron device.

24. The method of claim 14, further comprising introducing a plurality of the fixed negative charge with varying doses and energies in different regions of the electron device's structure.

25. The method of claim 14, further comprising performing a recess etch before, after or during introduction of the fixed negative charge.

26. The method of claim 14, wherein the gate length of the electron device is less than 0.2 microns and a breakdown voltage of the electron device is greater than 50 V.

27. A method for shaping an electric field in an electron device, comprising:
performing a plurality of fluorine treatments with varying doses and energies in different regions of the electron device's structure to locally modify the electric field's profile or distribution in the electron device, wherein the electron device includes a gate and a drain on a semiconductor material having a surface, a portion of the surface being between the gate and the drain but not directly under the gate, and the fluorine treatments are introduced in a region of the electron device that is directly under the portion of the surface.

28. The method of claim 27, wherein the electron device semiconductor material comprises GaN or AlGaN.

29. The method of claim 27, wherein the electron device is a high electron mobility transistor (HEMT).

30. The method of claim 29, wherein the fluorine treatments increase a turn-on voltage of a gate of the HEMT.

31. The method of claim 27, wherein the fluorine treatments are a negative charge that extends from a surface of the HEMT and stops before a channel of the HEMT or extends below the channel of the HEMT.

32. The method of claim 27, wherein the fluorine treatments are performed by implantation, thermal diffusion, or surface plasma treatment.

33. The method of claim 27, wherein the fluorine treatments are performed prior to a metallization of the electron device's gate.

34. The method of claim 27, wherein the electric field's shaping allows a reduction in an electric field peak in a channel region of the electron device.

35. The method of claim 27, wherein the fluorine treatment partially depletes electrons in a region surrounding or adjacent where the fluorine treatments are performed.

36. The method of claim 27, wherein the fluorine treatments are introduced below a gate of the electron device.

37. The method of claim 27, further comprising performing a recess etch before, after or during the fluorine treatments.

38. The method of claim 27, wherein the gate length of the electron device is less than 0.2 microns and a breakdown voltage of the electron device is greater than 50 V.

39. An electron device, comprising:
a gate and a drain on a semiconductor material layer, the semiconductor material layer having a surface, a portion of the surface being between the gate and the drain but not directly under the gate; and
negatively-charged fluorine ions in the semiconductor material layer that locally modify or shape an electric field's profile or distribution in the electron device, wherein:
the negatively-charged fluorine ions allow some of the electric field's lines to terminate away from the gate of the electron device, thereby reducing a crowding of the electric field lines and decreasing an electric field peak, and
the negatively-charged fluorine ions are in a region of the electron device that is directly under the portion of the surface.

40. The device of claim 39, wherein the semiconductor material layer comprises GaN or AlGaN.

41. The device of claim 39, wherein the electron device is a high electron mobility transistor (HEMT).

42. The device of claim 41, wherein the negatively-charged fluorine ions are a negative charge that extends from a surface of the HEMT and stops before a channel of the HEMT or extends below the channel of the HEMT.

43. The device of claim 39, wherein the negatively-charged fluorine ions are below the gate of the electron device.

44. A method for shaping an electric field in an electron device, comprising:
performing a fluorine treatment on the electron device using negatively-charged fluorine ions to locally modify or shape the electric field's profile or distribution in the electron device, wherein:
the electron device includes a gate and a drain on a semiconductor material having a surface, a portion of the surface being between the gate and the drain but not directly under the gate; and
the negatively-charged fluorine ions are introduced in a region of the electron device that is directly under the portion of the surface.

45. The method of claim 44, wherein the electron device semiconductor material comprises GaN or AlGaN.

46. The method of claim 44, wherein the electron device is a high electron mobility transistor (HEMT).

47. The method of claim 46, wherein the negatively-charged fluorine ions are a negative charge that extends from a surface of the HEMT and stops before a channel of the HEMT or extends below the channel of the HEMT.

48. The method of claim 44, wherein the negatively-charged fluorine ions are introduced below the gate of the electron device.

49. An electron device, comprising:
a gate and a drain on a semiconductor material layer, the semiconductor material layer having a surface, a portion of the surface being between the gate and the drain but not directly under the gate; and
negatively-charged fluorine ions in the semiconductor material layer that locally modify or shape an electric field's profile or distribution in the electron device, wherein:
the negatively-charged fluorine ions are introduced in a region of the electron device that is directly under the portion of the surface.

50. The device of claim 49, wherein the semiconductor material layer comprises GaN or AlGaN.

51. The device of claim 49, wherein the electron device is a high electron mobility transistor (HEMT).

52. The device of claim 51, wherein the negatively-charged fluorine ions are a negative charge that extends from a surface of the HEMT and stops before a channel of the HEMT or extends below the channel of the HEMT.

53. The device of claim 49, wherein the negatively-charged fluorine ions are below the gate of the electron device.

* * * * *